United States Patent [19]

Boroffka et al.

[11] 3,970,854
[45] July 20, 1976

[54] HIGH SPEED ION BEAM SWITCHING ARRANGEMENT FOR USE IN THE PRODUCTION OF DETERMINATE SOLID BODY DOPINGS BY MEANS OF ION IMPLANTATION

[75] Inventors: Hartmut Boroffka, Irschenhausen; Eberhard Krimmel, Pullach; Hartmut Runge, Kirchseeon, all of Germany

[73] Assignee: Siemens Aktiengesellschaft, Berlin & Munich, Germany

[22] Filed: May 20, 1974

[21] Appl. No.: 471,283

[30] Foreign Application Priority Data
May 23, 1973 Germany............................ 2326279

[52] U.S. Cl............................ 250/492 A; 250/281; 250/292
[51] Int. Cl.² ....................................... H01J 37/00
[58] Field of Search................ 250/492 A, 492, 398, 250/310, 311, 292; 219/121 EB

[56] References Cited
UNITED STATES PATENTS

| | | | |
|---|---|---|---|
| 3,117,022 | 1/1964 | Bronson et al.................. | 250/492 A |
| 3,150,257 | 9/1964 | Wilska............................... | 250/398 |
| 3,370,171 | 2/1968 | Ohta................................... | 250/283 |
| 3,682,729 | 8/1972 | Gukelberger et al........... | 250/492 A |
| 3,689,766 | 9/1972 | Freeman........................... | 250/492 A |
| 3,717,785 | 2/1973 | Guermet........................... | 250/492 A |
| 3,789,185 | 1/1974 | Baldwin............................ | 250/398 |

OTHER PUBLICATIONS
"Method for fast-switching the ion beam in an ion-implantation facility" Boroffka et al. Vacuum Science and Technology Dec. 1973 vol. 23, No. 12 pp. 447-449 250-492A.

Primary Examiner—Alfred E. Smith
Assistant Examiner—B. C. Anderson
Attorney, Agent, or Firm—Hill, Gross, Simpson, Van Santen, Steadman, Chiara & Simpson

[57] ABSTRACT

An arrangement for high speed ion beam switching in the production of determinate implantation doses for the doping, by ion implantation, in solid bodies, in which an electrode, preferably a diaphragm is interposed in the path of an ion beam from an ion source, and to which a potential is intermittently connected and disconnected in a controlled manner, to produce a potential wall which is disposed in the beam path of the ions, which has a value exceeding the kinetic energy of the ions, whereby the latter cannot pass therethrough.

13 Claims, 2 Drawing Figures

HIGH SPEED ION BEAM SWITCHING ARRANGEMENT FOR USE IN THE PRODUCTION OF DETERMINATE SOLID BODY DOPINGS BY MEANS OF ION IMPLANTATION

BACKGROUND OF THE INVENTION

The invention is directed to a high speed ion beam switching arrangement for use in the production of determinate solid body dopings by means of ion implantation, particularly in semiconductor material.

A determinate doping of the semiconductor material of semiconductor components is necessary if reproduceable results are to be achieved in production. While the control of the dose of a dopant implanted in a solid body can take place within wide dose ranges in known ion current integrators, considerable problems arise in connection with the exact termination of the ion implantation when the desired dose has been achieved, under control of an output signal from the ion current integrator. This was particularly true when, for reasons of economy, determinate implantation results, i.e. dopings, were to be achieved in short implantation times.

The following described processes have been followed, in accordance with the current prior art, in connection with the effecting of a predetermined implantation dose.

In one known process, a mechanically movable diaphragm, at the beginning of the implantation process, exposes the solid body which is to be implanted for bombardment, with such bombardment being terminated by again covering the body. The process can be automatically controlled by an ion current integrator of known construction. The sequence, however, is fairly long and inaccurate as the diaphragm possesses a certain minimum mass whereby it will not be unduly heated during the closed condition by the energy supplied by impacting ions.

In accordance with another known process, the ion beam is guided into the direction of bombardment by means of an electric voltage operatively connected to two capacitive deflector plates at the beginning of the implantation, and is diverted therefrom to effect a termination of the bombardment. The electric voltage connected to the deflector capacitor plates is dependent upon the ion energy, and must be matched to the latter whereby, in the case of high ion energies, may assume impractically high values i.e. 20 kV and above. This is particularly the case when the deflector capacitor is, as is usual, disposed at a location following the main ion acceleration section. Although this known arrangement permits short disconnection times, it has the disadvantage that during the disconnection state the ions hit some parts of the apparatus, whereby such ions, as a result of surface sputtering, additionally pollute the vacuum and therefore may lead to an undesired contamination of the solid bodies which are to be doped.

It is the objective of the present invention to provide an arrangement for high speed ion beam disconnection by means of which it is possible to achieve a sharply timed definite ion implantation, and in which disadvantages such as those above described with respect to the prior art eliminated.

BRIEF SUMMARY OF THE INVENTION

The desired objectives are realized, in accordance with the invention, by an arrangement in which the ions produced in an ion source are extracted therefrom by means of an electric field, preferably constant, whereby all the ions and ion types possess one and the same given kinetic energy, and with which they then pass through a mass separator. Preferably, it is not until the ions have passed through the mass separator that they are brought to the final desired energy in a main acceleration section, before they strike the solid body which is to be implanted, and by means of which they are decelerated and thus implantation effected. The implanted quantity of ions i.e. the so-called dose is measured by means of an ion current integrator which monitors the discharged electric charge.

In accordance with an embodiment of the invention, a diaphragm is preferably interposed between the ion source and the mass separator. In this embodiment of the invention, for effecting disconnection of the ion current, such diaphragm is connected to an electric potential having such a magnitude relative to the potential at the vicinity of the diaphragm, that an electric potential wall is produced. The potential across the diaphragm is so selected in relation to the kinetic energy of the ions at the location of the diaphragm, that the ions can no longer cross the potential wall, which thus acts as a rapid disconnector switch for the ion current striking the solid body.

The advantage of this arrangement resides in the fact that disconnection is practically wattless and the fact that when the diaphragm is disposed at a point on the path of the beam at which a low potential still exists a high blocking potential is not required for disconnection. Further, the blocking potential is constant when constant ion energy is provided, as for example in the preferred arrangement and as a result of the interposed mass separator, the solid body is not irradiated with parasitic ions, so that no contamination or pollution of the solid body can take place because the vacuum of that portion of the ion implantation system adjoining the separator is not subjected to pollution.

The invention can be employed irrespectively of whether the entire surface of the solid body is irradiated or whether the solid body is subjected to a scanned bombardment by an ion beam bundle focused on the solid body plane to achieve uniform doping.

BRIEF DESCRIPTION OF THE DRAWINGS

In the drawings, wherein like reference characters indicate like or corresponding parts.

DETAILED DESCRIPTION OF THE INVENTION

Figure 1:
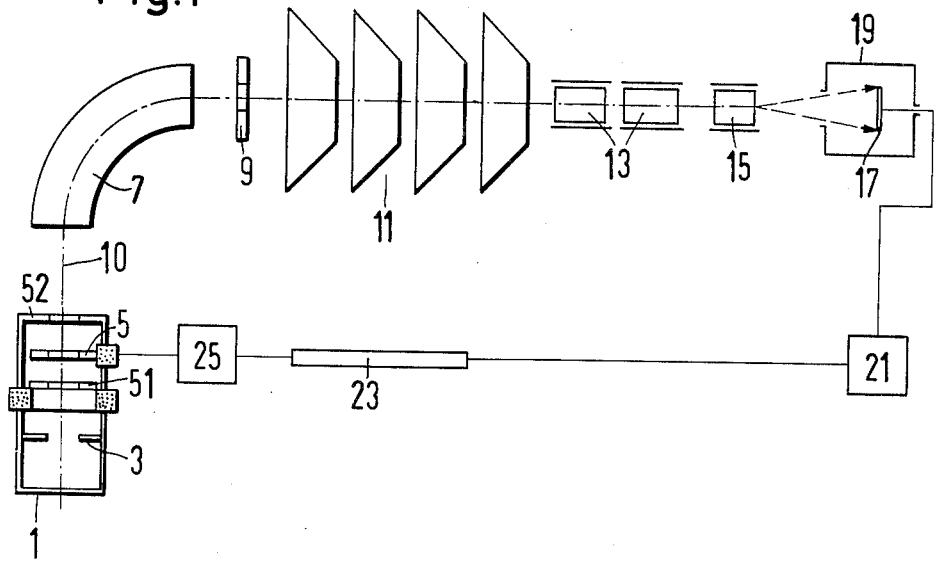
FIG. 1 represents, in schematic form, an ion implantation system, illustrating merely the fundamental components thereof necessary for an understanding of the invention.
Figure 2:
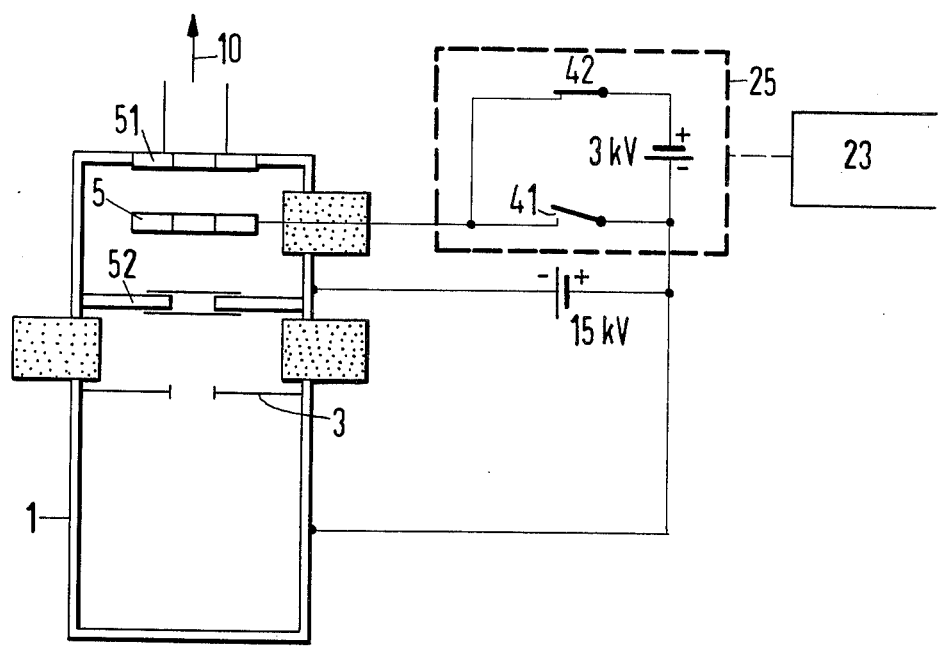
FIG. 2 schematically illustrates in greater detail the high speed ion beam disconnection structure disclosed in FIG. 1.

Referring to the exemplary preferred embodiment of the invention illustrated in FIGS. 1 and 2, the reference numeral 1 designates an ion source, and the reference numeral 3 an extraction system which withdraws ions produced in the source 1, with such ions having a path or course such as indicated by the arrow 10, with the ions being extracted by a utilization of a constant potential difference of 15 kV. Integrated with the extraction system 3 is a diaphragm 5 which, together with electrodes 51, 52 disposed adjacent to the diaphragm, for a lens structure which so focuses the ion beam that in the plane of the exit slit 9 of the mass separator 7, the ion beam possesses a minimum possible diameter. As a result, all ions of arbitrary types and mass always reach the plane of the exit slit 9 with the same energy of 15 keV. only ions of the type which reach the gap of the exit slit 9 can pass therethrough and subsequently pass through the main acceleration section 11, to which, for example, can be connected an acceleration voltage of between 0 and 300 kv. The ion beam having passed the acceleration section 11 may then be focused by an electrostatic quadruple lens system 13, upon the object 17 disposed at the target chamber 19. An electric scanning system 15 disposed between the quadruple lens system 13 and target chamber 19 enables the entire solid body to be irradiated in a scanned manner with the ion beam at a frequency of, for example, 50/1027 Hz.

In the preferred embodiments of the invention illustrated, the high speed ion beam disconnection is effected in a particularly advantageous manner with the aid of a voltage increase applied to the diaphragm 5 acting as an electrode. If a voltage of approximately +3 kV is additionally applied to the diaphragm 5, which normally, in relation to the exit slit 9 of the mass separator 7 carries approximately +15 kV there will be formed in the center of the diaphragm 5 a potential saddle surface, whose saddle point is such that no ions can pass such saddle, but are instead reflected therefrom and strike the extraction electrode from the rear where they are discharged and can be directly pumped away at this point as neutral particles, so that no such neutral particles can reach the mass separator. As the kinetic energy of the ions reaching the exit slit 9 of the mass separator 7 is always 15 keV, only the ions, to whose mass for which the separator 7 is set, can pass through the latter, and also as a result of which no parasitic ions can reach the solid body object 17 during the disconnection.

As only a small voltage increase need be applied to the diaphragm 5, the resulting control is achieved in a practically wattless manner, as a result of which no difficulty arises in achieving switching times of approximately 1 ms when the switching elements are in the form of special high voltage relays which permit a particularly simple and operationally reliable construction of the circuit. The connect-disconnect signals are conducted from the ion current integrator 21, of known construction, over a light signal path 23, of known construction, to the circuit 25 which is connected to high voltage.

When the ion beam is operatively connected, the diaphragm 5 is operatively connected over the closed relay contacts 41 to the focusing voltage which amounts to approximately +15 kV and is determined by a control unit, not illustrated. To effect disconnection of the ion beam the relay 41 is opened and the previously open relay 42 is closed so that there is now connected to the diaphragm 5 an excessive voltage of approximately +18 kV, which thereby functions to effect the desired blocking of the ions. In order to reconnect the ion beam, the reverse procedure is effected.

If shorter connection and disconnection time intervals are desired, the mechanical relays can be replaced by suitable electronic components.

By utilization of the relay-controlled ion beam disconnection system it is possible to achieve doping accuracies of solid bodies of approximately 1% or better if minimum implantation times of approximately 1 s are employed, Particularly important examples of usage of the present invention are in connection with the threshold voltage shift of integrated circuits in the semiconductor technique, or the implantation of predetermined profile for tuning diodes, in which cases, in particular for reasons of economy, very precise dopings are required.

From the standpoint of an overall dose, the connection of the ion beam is less critical than the disconnection of the ion current as the ion current integrator is set at zero at the beginning of the implantation and commences with the ion current integration at zero. Advantageously, however, the high speed disconnection can also be used for the connection of the ion beam.

Having thus described our invention it will be obvious that although various minor modifications might be suggested by those versed in the art, it should be understood that we wish to embody within the scope of the patent granted hereon all such modifications as reasonably, and properly come within the scope of our contribution to the art.

We claim as our invention:

1. In an arrangement for high speed ion beam switching, in the production of determinate implantation doses for the doping, by ion implantation, in solid bodies, which arrangement includes an ion source, a mass separator, a main acceleration system and a lens system, the combination of an electrode interposed in the path of an ion beam from said source preceding the main acceleration system, and switching means for intermittently connecting and disconnecting said electrode from a potential having a value, relative to the kinetic energy of the discharged ions, that upon application of such potential to said electrode, a potential wall will be produced thereat, disposed in the beam path of the ions and having a value exceeding the kinetic energy of such ions whereby the latter cannot pass therethrough, and an ion current integrator operatively disposed to monitor predetermined implantation dosage, operative to control at least the disconnection of the ion beam.

2. An arrangement according to claim 1, wherein said electrode is interposed between such ion source and a mass separator.

3. An arrangement according to claim 1, wherein said electrode comprises a diaphragm.

4. An arrangement according to claim 1, wherein additional electrodes are provided adjacent said electrode, forming a lens system which focuses the ions.

5. An arrangement according to claim 1, wherein the voltage supply for said potential applied to said electrode is connected thereto by switching means controlled by a light-optical signal transmission.

6. An arrangement according to claim 1, wherein said switching arrangement is operative to effect a connection and disconnection of the ion beam.

7. An arrangement according to claim 1, wherein such switching arrangement forms a part of a system for the production of semiconductor components.

8. An arrangement according to claim 3, wherein additional electrodes are provided adjacent said electrode, forming a lens system which focuses the ions.

9. An arrangement according to claim 8, wherein said electrode is interposed between such ion source and a mass separator.

10. An arrangement according to claim 9, wherein the voltage supply for said potential applied to said electrode is connected thereto by switching means controlled by a light-optical signal transmission.

11. An arrangement according to claim 10, wherein said ion current integrator is operative over said light-optical signal transmission to control at least the disconnection of the ion beam.

12. An arrangement according to claim 11, wherein said switching means is operative to effect a connection and disconnection of the ion beam.

13. An arrangement according to claim 11, wherein such switching means forms a part of a system for the production of semiconductor components.

* * * * *